US010547006B2

(12) United States Patent
Carroll

(10) Patent No.: US 10,547,006 B2
(45) Date of Patent: Jan. 28, 2020

(54) PHASE SEPARATED COMPOSITE LAYERS AND APPLICATIONS THEREOF

(71) Applicant: Wake Forest University, Winston-Salem, NC (US)

(72) Inventor: David Carroll, Winston-Salem, NC (US)

(73) Assignee: Wake Forest University, Winston-Salem, NC (US)

( * ) Notice: Subject to any disclaimer, the term of this patent is extended or adjusted under 35 U.S.C. 154(b) by 450 days.

(21) Appl. No.: 14/903,957

(22) PCT Filed: Jul. 9, 2014

(86) PCT No.: PCT/US2014/045992
§ 371 (c)(1),
(2) Date: Jan. 8, 2016

(87) PCT Pub. No.: WO2015/006473
PCT Pub. Date: Jan. 15, 2015

(65) Prior Publication Data
US 2016/0163988 A1 Jun. 9, 2016

Related U.S. Application Data

(60) Provisional application No. 61/844,223, filed on Jul. 9, 2013.

(51) Int. Cl.
*H01L 51/00* (2006.01)
*H01L 51/42* (2006.01)

(52) U.S. Cl.
CPC ...... *H01L 51/0047* (2013.01); *H01L 51/0037* (2013.01); *H01L 51/424* (2013.01); *H01L 2251/303* (2013.01)

(58) Field of Classification Search
CPC .............. H01L 51/0047; H01L 51/0001–56
USPC .................................. 136/243–265
See application file for complete search history.

(56) References Cited

U.S. PATENT DOCUMENTS

2007/0235076 A1* 10/2007 Liu ................ B82Y 10/00
                                                136/253
2008/0149178 A1  6/2008 Reyes-Reyes et al.
2010/0147386 A1* 6/2010 Benson-smith ....... H01L 51/002
                                                136/263

(Continued)

FOREIGN PATENT DOCUMENTS

WO 20120054495 A2 4/2012

OTHER PUBLICATIONS

International Search Report and Written Opinion issued in corresponding International Application No. PCT/US2014/045992, dated Nov. 28, 2014, 7 pages.

*Primary Examiner* — Niki Bakhtiari
(74) *Attorney, Agent, or Firm* — J. Clinton Wimbish; Nexsen Pruet PLLC

(57) ABSTRACT

In one aspect, composite layers are described herein demonstrating phase-separated architectures which, in some embodiments, can mitigate performance disadvantages of prior organic layers of optoelectronic devices. A composite organic layer described herein comprises nanocluster nodes and carbon nanoparticles disposed in a conjugated polymeric host, wherein the carbon nanoparticles are substantially phase separated from the conjugated polymeric host forming lamellar structures of carbon nanofibrils radiating from the nanocluster nodes.

26 Claims, 9 Drawing Sheets

(a)

(b)

(c)

(d)

(56) References Cited

U.S. PATENT DOCUMENTS

2012/0134618 A1 5/2012 Carroll
2013/0292658 A1* 11/2013 Weitekamp ......... H01L 51/0043
257/40

* cited by examiner (a) (b)

(c) (d)

(a) (b)

(c) (d)

(a)

(b)

(c)

1

PHASE SEPARATED COMPOSITE LAYERS AND APPLICATIONS THEREOF

RELATED APPLICATION DATA

This application is a U.S. National Phase of PCT/US2014/045992, filed Jul. 9, 2014, which claims priority pursuant to 35 U.S.C. § 119(e) to U.S. Provisional Patent Application Ser. No. 61/844,223 filed Jul. 9, 2013, both of which are incorporated by reference in their entireties.

FIELD

The present invention relates to nanocomposite films and, in particular, to nanocomposite films demonstrating phase-separated architectures.

BACKGROUND

Organic thin films continue to be heavily investigated for application in a variety of fields including organic light emitting devices (OLEDs), photovoltaic devices and organic photodetectors. Materials used to construct organic optoelectronic devices are relatively inexpensive in comparison to their inorganic counterparts, thereby providing cost advantages over optoelectronic devices manufactured with inorganic materials. Moreover, organic materials provide desirable physical properties, such as mechanical flexibility, permitting device constructions not attainable with rigid crystalline materials.

Organic thin films, however, suffer from performance disadvantages in comparison to crystalline inorganic materials. For example, some organic photovoltaic devices demonstrate efficiencies of 1% or less. Low efficiencies often displayed in organic photovoltaic devices result from a severe scale mismatch between exciton diffusion length ($L_D$) and organic layer thickness. Efficient absorption of visible electromagnetic radiation generally requires organic film thickness of 500 nm or more. This thickness greatly exceeds exciton diffusion length which is typically about 50 nm, often resulting in exciton recombination. Given the disparity in performance, organic photovoltaic devices have encountered significant difficulty in challenging traditional inorganic devices.

SUMMARY

In one aspect, composite layers are described herein demonstrating phase-separated architectures which, in some embodiments, can mitigate performance disadvantages of prior organic layers of optoelectronic devices. A composite organic layer described herein comprises nanocluster nodes and carbon nanoparticles disposed in a conjugated polymeric host, wherein the carbon nanoparticles are substantially phase separated from the conjugated polymeric host forming lamellar structures of carbon nanofibrils around or radiating from the nanocluster nodes. In some embodiments, for example, the carbon nanofibrils radiate a distance of at least 500 nm or at least 1 µm from the nanocluster nodes providing enhanced pathways for exciton dissociation and transport.

In another aspect, photovoltaic apparatus are described herein. A photovoltaic apparatus comprises first and second electrodes and a photosensitive layer positioned between the first and second electrodes, the photosensitive layer comprising nanocluster nodes and carbon nanoparticles disposed in a conjugated polymeric host, wherein the carbon nanoparticles are substantially phase separated from the conjugated polymeric host forming lamellar structures of carbon nanofibrils around or radiating from the nanocluster nodes.

In a further aspect, methods of producing composite layers are described herein. A method of producing a composite layer comprises mixing inorganic nanoparticles, conjugated polymeric phase and carbon nanoparticles in an organic solvent, aggregating the inorganic nanoparticles in the conjugated polymeric phase to provide nanocluster nodes and phase separating the carbon nanoparticles from the conjugated polymeric phase as lamellar structures of carbon nanofibrils around or radiating from the nanocluster nodes during removal of the organic solvent.

These and other embodiments are further described in the following detailed description.

DETAILED DESCRIPTION

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

I. Composite Layers

Composite layers are described herein demonstrating phase-separated architectures. Such phase-separated architectures, in some embodiments, can mitigate performance disadvantages of prior organic layers of optoelectronic devices. For example, phase-separated architectures of composite layers described herein can provide enhanced pathways for exciton separation and collection in photovoltaic apparatus, thereby realizing enhanced efficiencies.

Figure 1:
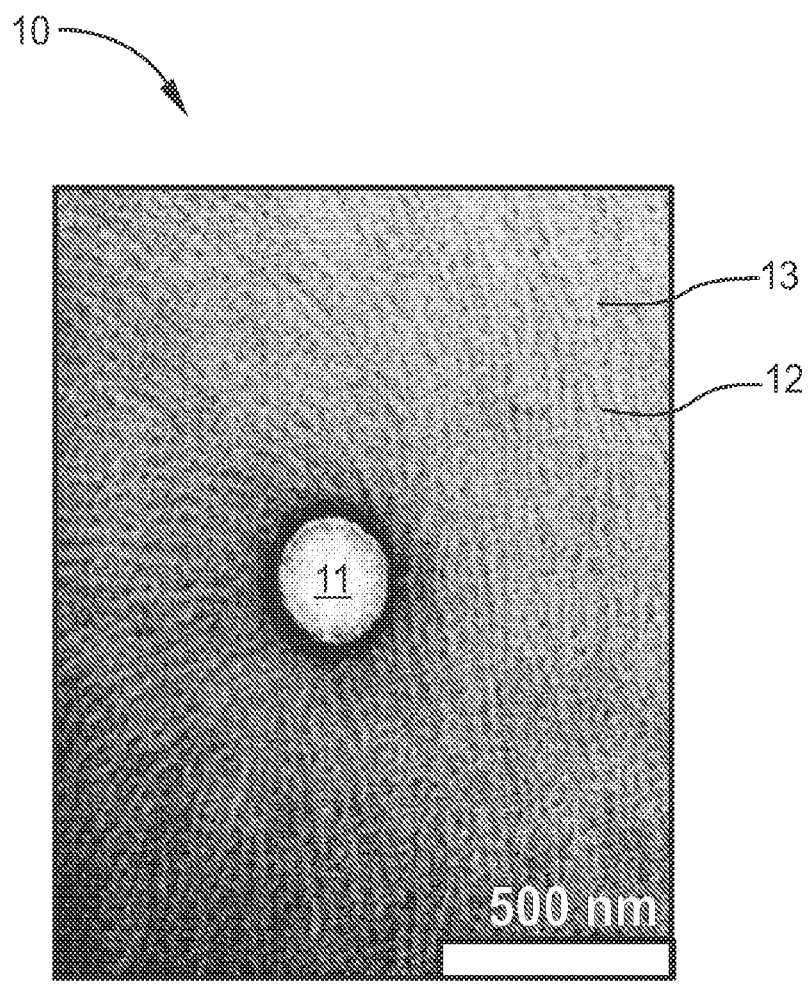
FIG. 1 is a transmission electron microscopy (TEM) image of a section of a composite layer according to one embodiment described herein.

A composite organic layer described herein comprises nanocluster nodes and carbon nanoparticles disposed in a conjugated polymeric host, wherein the carbon nanoparticles are substantially phase separated from the conjugated polymeric host forming lamellar structures of carbon nanofibrils radiating from the nanocluster nodes. FIG. 1 is a TEM image of a section of a composite layer according to one embodiment described herein. As illustrated in FIG. 1, the composite layer section (10) comprises a nanoparticle cluster (11) and lamellar structures of carbon nanofibrils (12) radiating from the nanoparticle cluster (11). In the embodiment of FIG. 1, the carbon nanofibrils (12) are formed of fullerene conjugate 1-(3-methoxycarbonyl)propyl-1-phenyl-(6,6)$C_{61}$, (PCBM) phase separated from the conjugated polymeric host (13) of poly[4,4-didodecyl pentaleno[1,2-b]dithiophene-co-5-octyl-5H-thieno[3,4-c]pyrrole-4,6-dione. The carbon nanofibrils (12) extend outward from the nanocluster (11) distances well in excess of 500 nm. Further, the conjugated polymeric host (13) can also form nanofibrils alternating with the carbon nanofibrils (12) in the lamellar structure.

Turning now to specific components, a composite layer described herein comprises a conjugated polymeric host. The conjugated polymeric host can be formed of any conjugated polymer operable to participate in the formation of lamellar structures described herein. In some embodiments, for example, suitable conjugated polymer demonstrates a surface energy less than nanoparticles forming the nanoparticle cluster. Further, the conjugated polymer host and carbon nanoparticles demonstrate a difference in surface energies sufficient to induce phase separation in the presence of the nanocluster nodes. For example, in some embodiments, the conjugated polymer host exhibits a surface energy less than the carbon nanoparticles. As discussed further herein, conjugated polymer surface energies can be altered and/or tailored by the presence of hydrophobic or hydrophilic side chains of the conjugated polymer.

In some embodiments, the conjugated polymeric host can comprise polythiophenes, polythiophene derivatives or mixtures thereof. Polythiophene derivatives can include mono- or di-thiophenes coupled with thienopyrrole moieties, benzoxadiazole moieties or benzothiadiazole moieties. Further, polythiophenes can be provided hydrocarbon and/or alkoxide side chains of suitable length for tailoring surface energy of the polymer for phase separation and/or interaction with carbon nanoparticles forming the carbon nanofibrils. Conjugated polymer side chains can be linear, branched or cyclic and generally formed of at least 10 carbon atoms. In some embodiments, hydrocarbon side chains incorporate 12-20 carbon atoms. Table I provides several polythiophenes that may be used in the conjugated polymeric phase according to some embodiments herein.

TABLE I

Polythiophenes of Conjugated Polymeric Phase poly[4,4-didodecyl pentaleno[1,2-b]dithiophene-co-5-octyl-5H-thieno[3,4-c]pyrrole-4,6-dione
poly[4,8-bis(1-pentylhexyloxy)-benzo[1,2-b: 4,5-b0]dithiophene-2,6-diyl-alt-2,1,3-benzoxadiazole-4,7-diyl
poly(3-cyclohexyl-4-methylthiophene)
poly(3-cyclohexylthiophene-2,5-diyl)
poly(3-decyloxythiophene-2,5-diyl)

TABLE I-continued

Polythiophenes of Conjugated Polymeric Phase poly(3-octylthiophene-2,5-diyl-co-3-decyloxythiophene-2,5-diyl)
poly(3-decylthiophene-2,5-diyl)
poly[(2,5-didecyloxy-1,4-phenylene)-alt-(2,5-thienylene)]

Further, polythiophene of the conjugated polymeric phase can have a structure selected from Formulas I and II below.

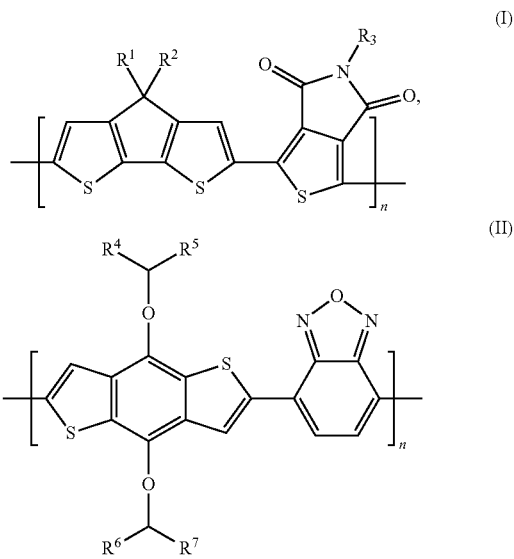

wherein $R^1$, $R^2$ and $R^3$ are selected from the group consisting of $C_8$-$C_{20}$ alkyl, $C_8$-$C_{20}$ alkenyl, cycloalkyl, aryl, heteroaryl, alkyl-aryl, alkyl-heteroaryl and alkyl-cycloalkyl and $R^4$, $R^5$, $R^6$ and $R^7$ are selected from the group consisting of hydrogen, $C_4$-$C_{20}$ alkyl, $C_4$-$C_{20}$ alkenyl, cycloalkyl, aryl, heteroaryl, alkyl-aryl, alkyl-heteroaryl and alkyl-cycloalkyl.

The conjugated polymeric host can also be formed of other conjugated or semiconducting polymers demonstrating sufficient difference in surface energy with the carbon nanoparticles or other electrically conductive nanoparticles to induce phase separation in the presence of the nanocluster nodes. For example, the polymeric host may be formed of semiconducting polymers including phenylene vinylenes, such as poly(phenylene vinylene) and poly(p-phenylene vinylene) (PPV), and derivatives thereof. In some embodiments, semiconducting polymers can comprise poly fluorenes, naphthalenes, and derivatives thereof. In some embodiments, semiconducting polymers comprise poly(2-vinylpyridine) (P2VP), polyamides, poly(N-vinylcarbazole) (PVCZ), polypyrrole (PPy), and polyaniline (PAn). In some embodiments, a semiconducting polymer comprises poly[2,6-(4,4-bis-(2-ethylhexyl)-4H-cyclopenta[2,1-b;3,4-b']dithiophene)-alt-4,7-(2,1,3-benzothiadiazole)] (PCPDTBT).

As described herein, the conjugated polymeric host can exhibit a surface energy lower than the carbon nanoparticles, resulting in phase separation with the carbon nanoparticles in the presence of the nanocluster nodes. Hydrophobic or hydrophilic side chains can be used to modify the surface energy of the conjugated polymeric host. For example, branched alkyl or alkenyl side chains can be employed to lower the polar component of the conjugated polymer surface energy. In some embodiments, suitable conjugated polymeric hosts have a polar component contributing from 1% to 9% of the total polymer surface energy. In some embodiments, the polar component of suitable conjugated polymer contributes 1-5% of the total polymer surface energy.

The conjugated polymeric host can be present in the composite layer in any amount not inconsistent with the objectives of the present invention. The conjugated polymeric host, for example, can be present in the composite layer in an amount of 20-80 wt. %. In some embodiments, the conjugated polymeric host is present in an amount of 30-70 wt. % or 40-60 wt. %.

As described herein, nanocluster nodes are disposed in the conjugated polymeric host. Nanocluster nodes can be formed of a material having a higher surface energy than the conjugated polymeric host leading to clustering of the material when contacted with the polymeric host. Nanocluster nodes, for example, can be formed of inorganic nanoparticles. Higher surface energy of the inorganic nanoparticles induces aggregation of the nanoparticles into nanoclusters in the conjugated polymeric host. Inorganic nanoparticles can comprise metal nanoparticles, metal oxide nanoparticles, semiconductor nanoparticles or mixtures thereof. In some embodiments, metal nanoparticles are transition metal nanoparticles. Additionally, metal oxide nanoparticles can comprise transition metal oxides. Transition metal oxides can include oxides of metallic elements of Groups IIB-VIB of the Periodic Table, Metal oxides can also include alkaline earth metal oxides. In some embodiments, for example, metal oxide nanoparticles are ZnO and $TiO_2$.

As with the conjugated polymeric host, the inorganic nanoparticles exhibit a surface energy suitable for forming the phase separated compositions described herein. In some embodiments, inorganic nanoparticles with exceedingly high surface energy, such as silver oxide nanoparticles, preclude formation of phase separated lamella structures. However, lower surface energy nanoparticles including ZnO, $TiO_2$ and similar species, are suitable for phase separated compositions described herein.

Nanoparticles forming nanocluster nodes in the conjugated polymeric host can have any size and shape not inconsistent with the objectives of the present invention. In some embodiments, nanoparticles of a nanocluster have an average size ranging from 5-30 nm or 10-20 nm. Further, nanocluster nodes in the conjugated polymeric host can have average diameter of 100-500 nm. Moreover, nanocluster nodes can demonstrate a variety of geometries including spherical, elliptical or irregular shape. Nanocluster nodes can generally be present in the conjugated polymeric host in an amount of 0.1-10 wt. %. In some embodiments, nanocluster nodes are present in the conjugated polymeric host in an amount of 0.5-5 wt. %.

In addition to nanocluster nodes, carbon nanoparticles are also disposed in the polymeric host, wherein the carbon nanoparticles are phase separated from the conjugated polymeric host forming carbon nanofibrils radiating from the nanocluster nodes. In some embodiments, suitable carbon nanoparticles have surface energy greater than the conjugated polymeric host. Further, the carbon nanoparticles and conjugated polymeric host demonstrate a difference in surface energies sufficient to induce phase separation in the presence of the nanocluster nodes.

Carbon nanoparticles, according to some embodiments, comprise fullerenes and fullerene derivatives. As shown further herein, 1-(3-methoxycarbonyl)propyl-1-phenyl-(6,6) $C_{61}$, (PCBM) can serve as carbon nanoparticles forming the phase separated nanofibrils. Other fullerene derivatives can include higher order fullerenes ($C_{70}$ and higher) and endo-metallo-fullerenes (fullerenes having at least one metal atom therein). Carbon nanoparticles can also comprise single-walled carbon nanotubes (SWNT), multi-walled carbon nanotubes (MWNT) or mixtures thereof. Surfaces of carbon nanoparticles can be modified with one or more side chains for tailoring surface energy of the nanoparticles for phase separation and/or interaction with the conjugated polymeric phase.

Carbon nanoparticles are present in the conjugated polymeric host in an amount sufficient to form the phase separated carbon nanofibrils. In some embodiments, carbon nanoparticles are present in the conjugated polymeric host in an amount of 20 to 80 wt. %. Carbon nanoparticles can be present in the conjugated polymeric host in an amount of 30 to 70 wt. % or 35 to 65 wt. %. Further, carbon nanoparticles can be present in the conjugated polymeric host in an amount of 50 to 66 wt. %.

As described herein, the carbon nanoparticles phase separate from the conjugated polymeric phase in the presence of the nanoclusters forming lamellar structures of carbon nanofibrils with the conjugated polymeric phase. The nanofibrils can radiate from the nanoclusters nodes a considerable distance or length into the conjugated polymeric host. In some embodiments, nanofibrils radiate a distance of at least 1 μm from one or more nanocluster nodes. Carbon nanofibrils, in some embodiments, radiate a distance from a nanocluster node a distance provided in Table II.

TABLE II

| Distance or Length of Carbon Nanofibrils (μm) |
| --- |
| ≥1.5 |
| ≥2 |
| ≥3 |
| ≥4 |
| 0.5-5 |
| 1-5 |
| 0.5-10 |
| 1-7 |

In addition to length, phase separated carbon nanofibrils can demonstrate various widths. For example, carbon nanofibrils can have widths ranging from 5 to 30 nm. In some embodiments, carbon nanofibrils have widths of 10 to 20 nm or 10 to 15 nm. As discussed further herein, width of carbon nanofibrils can be controlled by one or more composite layer processing conditions.

In some embodiments, carbon nanoparticles can be replaced with one or more species of inorganic nanoparticles to form electrically conductive or semiconductive inorganic nanofibrils radiating from nanocluster nodes in the conjugated polymeric host. For example, inorganic nanoparticles demonstrating differences in surface energy with the conjugated polymeric host sufficient to induce phase separation into electrically conductive nanofibrils in the presence of the nanocluster nodes can be used. In some embodiments such nanoparticles comprise semiconducting nanoparticles, including III/V and/or II/VI semiconductor nanoparticles or quantum dots. Further, inorganic nanoparticles can comprise metal nanoparticles, including transition metal nanoparticles.

II. Photovoltaic Apparatus

In another aspect, photovoltaic apparatus are described herein. A photovoltaic apparatus comprises first and second electrodes and a photosensitive layer positioned between the first and second electrodes, the photosensitive layer comprising nanocluster nodes and carbon nanoparticles disposed in a conjugated polymer host, wherein the carbon nanoparticles are substantially phase separated from the conjugated polymeric host forming lamellar structures of carbon nanofibrils radiating from the nanocluster nodes.

Turning now to specific components, photovoltaic apparatus comprise first and second electrodes. First and second electrodes can be formed of any electrically conductive material not inconsistent with the objectives of the present invention. First and second electrodes, for example, can be formed of metal or alloy, including aluminum or transition metals or alloys. In some embodiments, one or both of the first and second electrodes are radiation transmissive. A radiation transmissive electrode can be formed of a radiation transmissive conducting oxide. Radiation transmissive conducting oxides, in some embodiments, can comprise indium tin oxide (ITO), gallium indium tin oxide (GITO) or zinc indium tin oxide (ZITO). In another embodiment, a radiation transmissive electrode can comprise a radiation transmissive polymeric material such as polyaniline (PANI) and its chemical relatives. In some embodiments, 3,4-polyethylenedioxythiophene (PEDOT) can be a suitable radiation transmissive polymeric material for the first and/or second electrode. In other embodiments, a radiation transmissive electrode can comprise a metal or carbon nanotube layer having a thickness operable to at least partially pass visible electromagnetic radiation.

In addition to first and second electrodes, photovoltaic apparatus described herein comprise a photosensitive layer comprising nanocluster nodes and carbon nanoparticles disposed in a conjugated polymeric host, wherein the carbon nanoparticles are substantially phase separated from the conjugated polymeric host forming lamellar structures of carbon nanofibrils radiating from the nanocluster nodes. Components of the photosensitive layer, including the nanocluster nodes, conjugated polymeric host and carbon nanoparticles, can have compositional parameters and/or properties described for the same in Section I hereinabove. Further, carbon nanofibrils formed by phase separation of the carbon nanoparticles from the conjugated polymeric host can have any properties described in Section I.

Conjugated polymer host of the photosensitive layer can demonstrate various electromagnetic radiation absorption profiles. Conjugated polymer, for example, can be selected to have absorption maxima in the visible region of the electromagnetic spectrum. In some embodiments, conjugated polymer can also absorb wavelengths in the ultraviolet and/or infrared regions of the spectrum. Excitons are generated in the photosensitive layer by absorption of radiation by the conjugated polymeric phase. Further, exciton dissociation can be precipitated at heterojunctions formed between the conjugated polymeric host and carbon nanofibrils of the photosensitive layer. The conjugated polymeric host, for example, serves as a donor material and the carbon nanofibrils serve as the acceptor material, thereby forming heterojunctions operable to for the separation of excitons into holes and electrons.

Given their structure over large distances, carbon nanofibrils of the photosensitive layer facilitate charge transport, thereby enhancing charge collection and efficiency of the photovoltaic apparatus. Further, the photosensitive layer can be made thicker for enhanced absorption characteristics due to the extended structure of the carbon nanofibrils. For example, the photosensitive layer can have a thickness of 200 nm to 1 µm. In some embodiments, the photosensitive organic layer has a thickness in excess of 1 µnm.

Photovoltaic apparatus described herein can further comprise additional layers such as one or more exciton blocking layers. An exciton blocking layer (EBL) can act to confine photogenerated excitons to the region near the dissociating interface and prevent parasitic exciton quenching at a photosensitive layer/electrode interface. In addition to limiting the path over which excitons may diffuse, an EBL can additionally act as a diffusion barrier to substances introduced during deposition of the electrodes. In some embodiments, an EBL can have a sufficient thickness to fill pin holes or shorting defects which could otherwise render an organic photovoltaic device inoperable.

An EBL can comprise a polymeric material such as polyethylenedioxythiophene-polystyrenesulfonate (PEDOT:PSS). Alternatively, an EBL can comprise a composite material. For example, an EBL can comprise carbon nanoparticles dispersed in 3,4-polyethylenedioxythiophene:polystyrenesulfonate (PEDOT:PSS). In another embodiment, an EBL comprises carbon nanoparticles dispersed in poly(vinylidene chloride) and/or copolymers thereof In further embodiments, EBLs can comprise any polymer having work function energy operable to permit the transport of holes while impeding the passage of electrons. In some embodiments, an EBL may be disposed between the anode and photosensitive layer of the photovoltaic apparatus.

Additionally, one or more layers of metal oxide can be introduced into the photovoltaic architecture. For example, a layer of $Li_2O$ and/or $MoO_3$ can be positioned between the photosensitive layer and the cathode. Alternatively, a layer of LiF can be positioned between the photosensitive layer and the cathode.

Electrodes of the photovoltaic apparatus, in some embodiments, can serve as support(s) for the photosensitive layer. Alternatively, the photovoltaic construction can be supported by an external substrate. Suitable external substrates can be planar or curved. In some embodiments, an external supporting substrate comprises a planar sheet of glass or plastic. Moreover, an external substrate can have a cylindrical geometry. A cylindrical substrate can be a tube or fiber, such as an optical fiber. In embodiments wherein the support is an optical fiber, electromagnetic radiation can be delivered to the photosensitive layer from the interior of the fiber and/or sides of the fiber. In tubular constructions, various liquids can be flowed through the tube interior for collection of thermal energy. Optical fiber and tubular substrates are described in greater detail in U.S. patent application Ser. Nos. 12/298,942 and 13/880,310 respectively.

As described herein, carbon nanofibrils can provide enhanced pathways for exciton separation and collection in photovoltaic apparatus, thereby realizing enhanced efficiencies. For example, a photovoltaic apparatus described herein, in some embodiments, can demonstrate external quantum efficiency (EQE) greater than 20% at one or more wavelengths in the visible spectrum. In some embodiments, a photovoltaic apparatus described herein demonstrates EQE of 20-25% at one more wavelengths in the visible spectrum.

III. Methods of Producing Composite Layers

In a further aspect, methods of producing composite layers are described herein. A method of producing a composite layer comprises mixing inorganic nanoparticles, conjugated polymeric phase and carbon nanoparticles in an organic solvent, aggregating the inorganic nanoparticles in the conjugated polymeric phase to provide nanocluster nodes and phase separating the carbon nanoparticles from the conjugated polymeric phase as lamellar structures of carbon nanofibrils radiating from the nanocluster nodes during removal of the organic solvent.

Components of methods described herein, including the inorganic nanoparticles, conjugated polymeric phase and carbon nanoparticles, can have compositional parameters and/or properties described for the same in Section I hereinabove. For example, inorganic nanoparticles can comprise transition metal oxide nanoparticles while the conjugated polymeric phase is formed of a polythiophene listed in Table I above, and the carbon nanoparticles comprise fullerenes or fullerene derivatives. Further, nanofibrils formed by phase separation of the carbon nanoparticles from the conjugated polymeric phase can have any properties described in Section I herein.

As discussed further herein, width of the phase separated carbon nanofibrils can be altered depending on various processing conditions, including the removal rate of the organic solvent. For example, nanofibril width can be inversely proportional to solvent removal rate providing the ability to tailor phase separated architectures of the composite layer. Solvent removal rate can be varied by using organic solvents of differing vapor pressure and/or use of differing drying temperatures. In some embodiments, additive(s) can be combined with organic solvent to alter the solvent vapor pressure, producing the desired drying rate and nanofibril morphology.

These and other embodiments are further illustrated by the following non-limiting examples.

Example 1—Composite Layer

A composite layer was formed by providing a mixture of zinc oxide (ZnO) nanoparticles (10-20 nm), PCBM and conjugated polymer of poly[4,4-didodecyl pentaleno[1,2-b]dithiophene-co-5-octyl-5H-thieno[3,4-c]pyrrole-4,6-dione in chlorobenzene solvent. Conjugated polymer and PCBM were present in the mixture in a ratio of 1:1 (polymer:PCBM). Further, ZnO nanoparticles were present in an amount sufficient to achieve about a 1.5 wt. % loading in the final composite layer. The mixture was deposited on a copper grid substrate by spin casting, and the chlorobenzene solvent was removed by drying.

The resulting composite layer is illustrated in the TEM sectional view of FIG. 1. As illustrated in FIG. 1, the composite layer section (10) comprises a nanoparticle cluster (11) and lamellar structures of carbon nanofibrils (12) and conjugated polymer nanofibrils (13) radiating from the nanoparticle cluster (11). In the embodiment of FIG. 1, the carbon nanofibrils (12) are formed of fullerene conjugate 1-(3-mehtoxycarbonyl)propyl-1-phenyl-(6,6)$C_{61}$, (PCBM) phase separated from the nanofibrils (13) of the poly[4,4-didodecyl pentaleno[1,2-b]dithiophene-co-5-octyl-5H-thieno[3,4-c]pyrrole-4,6-dione host. The carbon nanofibrils (12) extend outward from the nanocluster (11) distances well in excess of 500 nm.

Figure 2:
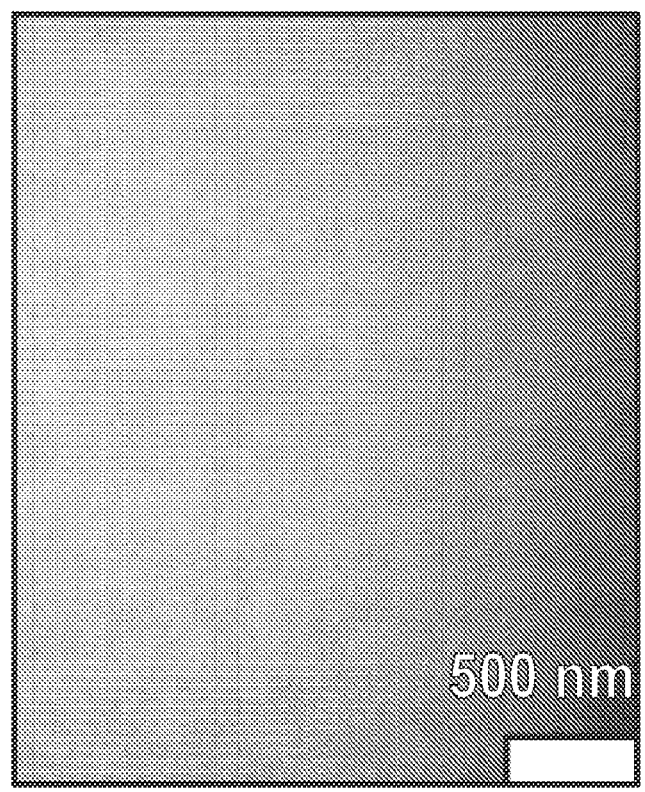
FIG. 2 is a sectional TEM image of a comparative layer formed of conjugated polymer and carbon nanoparticles not employing nanocluster nodes.
Figure 3:
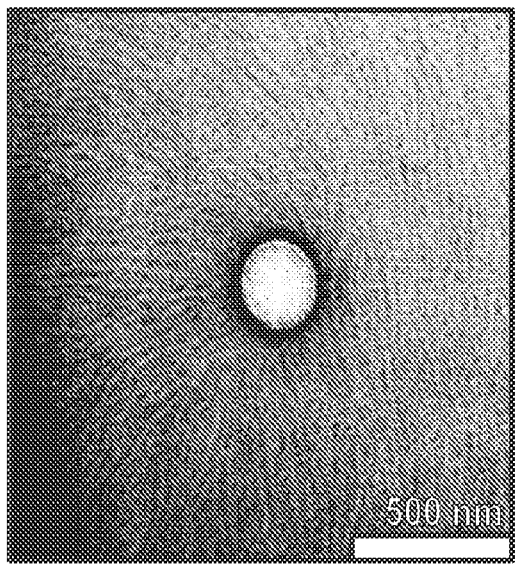
FIGS. 3(a)-(d) are sectional TEM images of composite layers according to some embodiments described herein.
Figure 3:
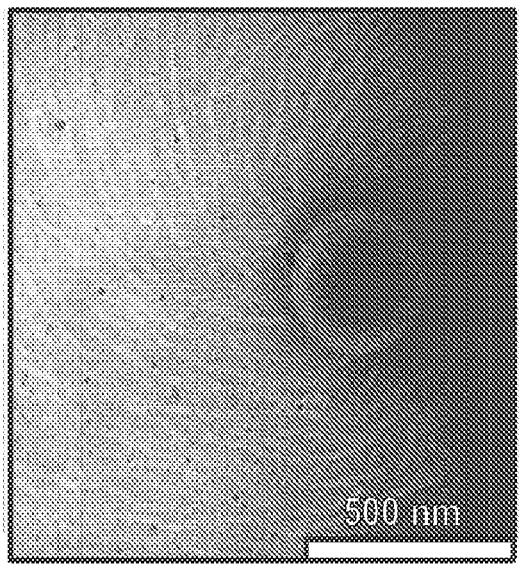
Figure 3:
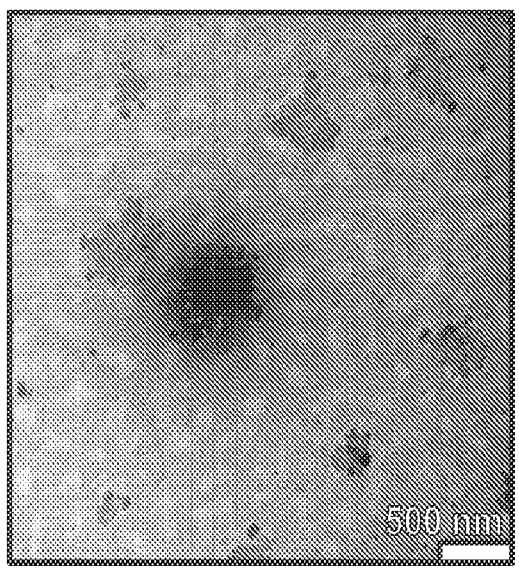
Figure 3:
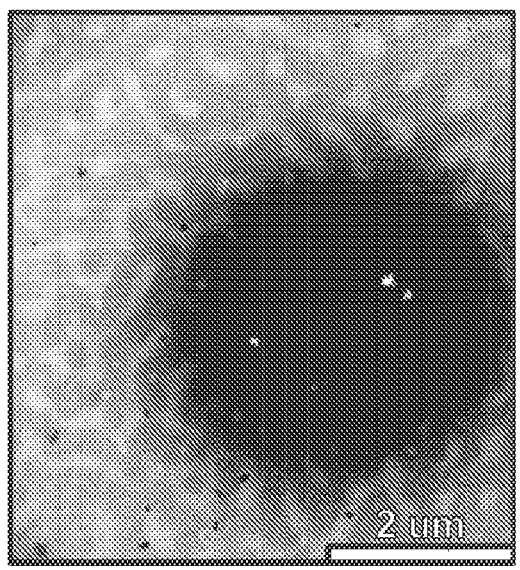

A comparative layer was produced in a substantially identical manner, the difference being the absence of ZnO nanoparticles in the mixture. As provided in FIG. 2, the resulting layer did not demonstrate any specific phase-separated architectures and mirrored prior organic films incorporating PCBM.

Example 2—Composite Layer

Figure 9:
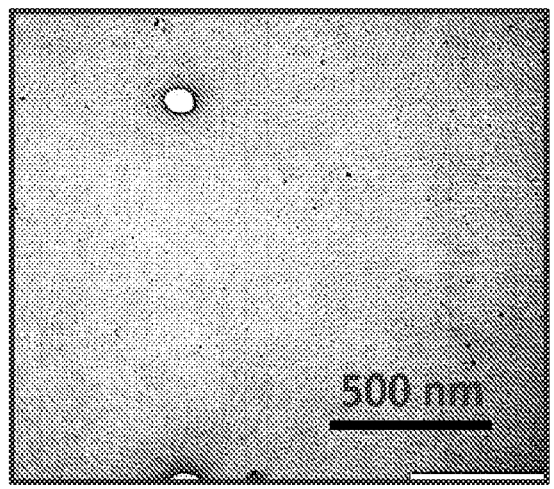
FIGS. 9(a)-(b) are sectional TEM images of composite layers according to some embodiments described herein.
FIG. 9(c) is a sectional TEM images of a composite layer wherein inorganic nanoparticles are not present.
Figure 9:
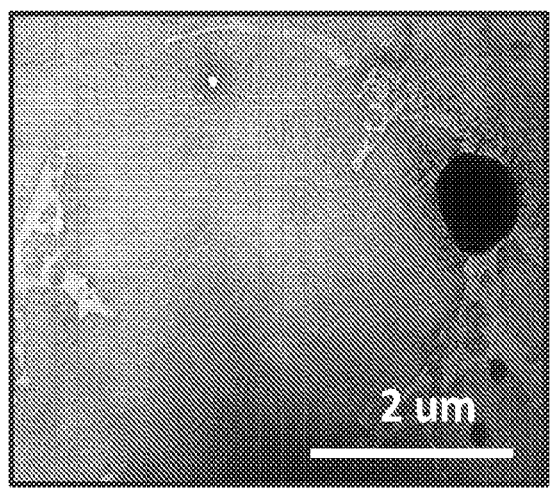
Figure 9:
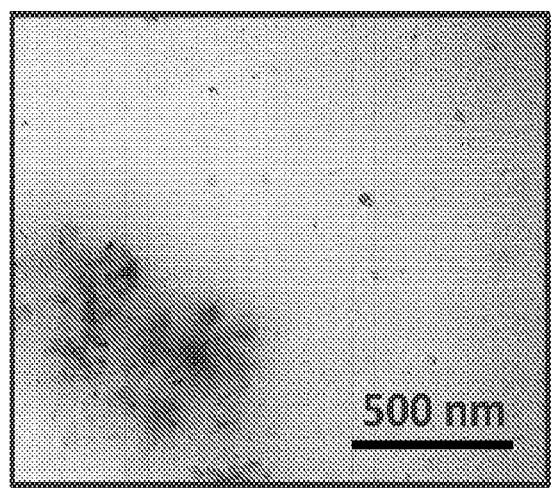

A composite layer was formed in accordance with the protocol of Example 1, the difference being the ZnO nanoparticles were present in an amount sufficient to achieve about a 0.75 wt. % loading in the final composite layer. FIGS. 9(a) and 9(b) are sectional TEM images of the resulting composite layer at differing magnifications. The scale bar in FIG. 9(a) is 500 nm, and the scale bar in FIG. 9(b) is 2 μm. As illustrated in FIG. 9(b), the carbon nanofibrils extend from the ZnO nanoparticle cluster distances on the order of microns. For comparative purposes, a composite layer was prepared in accordance with Example 1, wherein the ZnO nanoparticles were not employed. Absence of the ZnO nanoparticles precluded the formation of lamella structures as show in the TEM of FIG. 9(c).

Example 3—Composite Layer

A composite layer was formed in accordance with the protocol of Example 1, the difference being the ZnO nanoparticles were replaced with $TiO_2$ nanoparticles (10-20 nm). The resulting composite layer demonstrated lamellar structures of carbon nanofibrils radiating from nanocluster nodes, similar to that shown in FIG. 1.

Example 4—PCBM Loading in Composite Layer

Composite layers 3-6 were produced in accordance with Example 1, wherein loading of PCBM in the composite layer was increased to provide conjugated polymer:PCBM ratios of Table III.

TABLE III

| Composite Layer polymer:PCBM ratios | | |
|---|---|---|
| Composite Layer | Conjugated Polymer:PCBM Ratio | FIG. |
| 3 | 1:1 | 3(a) |
| 4 | 1:2 | 3(b) |
| 5 | 1:3 | 3(c) |
| 6 | 1:4 | 3(d) |

As illustrated in FIGS. 3(a)-(d), the phase separated carbon nanofibrils readily formed at ratios of 1:1 and 1:2. At higher ratios of 1:3 and 1:4, the PCBM begins to crystallize into large clusters losing the nanofibril morphology proximate the nanoclusters. It was noticed, however, that for a ratio of 1:4, the nanofibril morphology was re-established in regions distant from the nanocluster nodes [FIG. 3(d)].

Example 5—Inorganic Nanoparticle Loading in Composite Layer

Composite layers 7-9 were produced in accordance with Example 1, wherein loading of the ZnO nanoparticles varied according to Table IV, and the conjugated polymer:PCBM ratio was held constant at 1:2 for each composite layer.

TABLE IV

| Composite Layer Inorganic Nanoparticle Loadings | | |
|---|---|---|
| Composite Layer | ZnO Nanoparticle Loading (wt. %) | FIG. |
| 7 | 5 | 4(a) |
| 8 | 2.5 | 4(b) |
| 9 | 1.2 | 4(c) |

Figure 4:
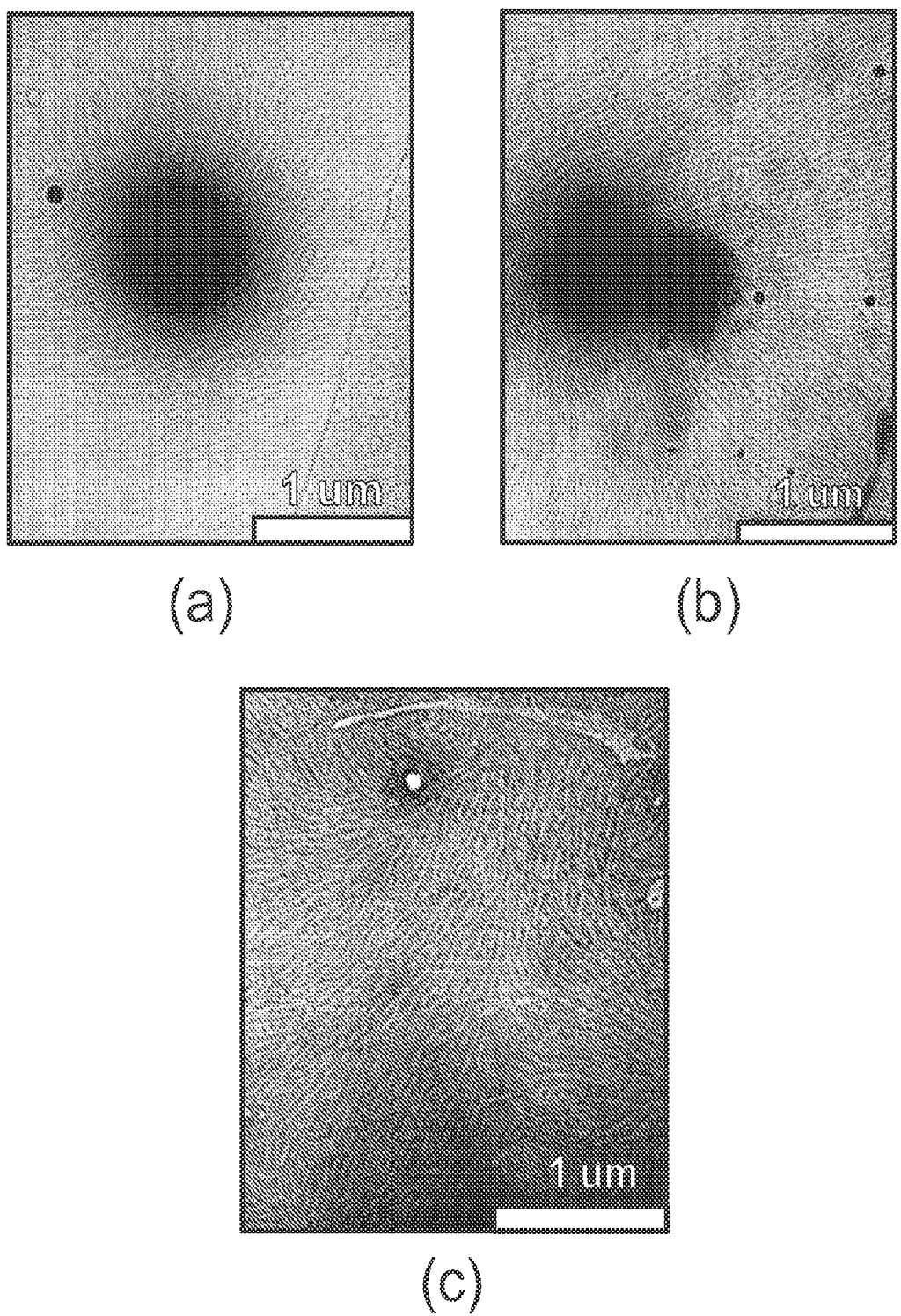
FIGS. 4(a)-(c) are sectional TEM images of composite layers according to some embodiments described herein.
Figure 5:
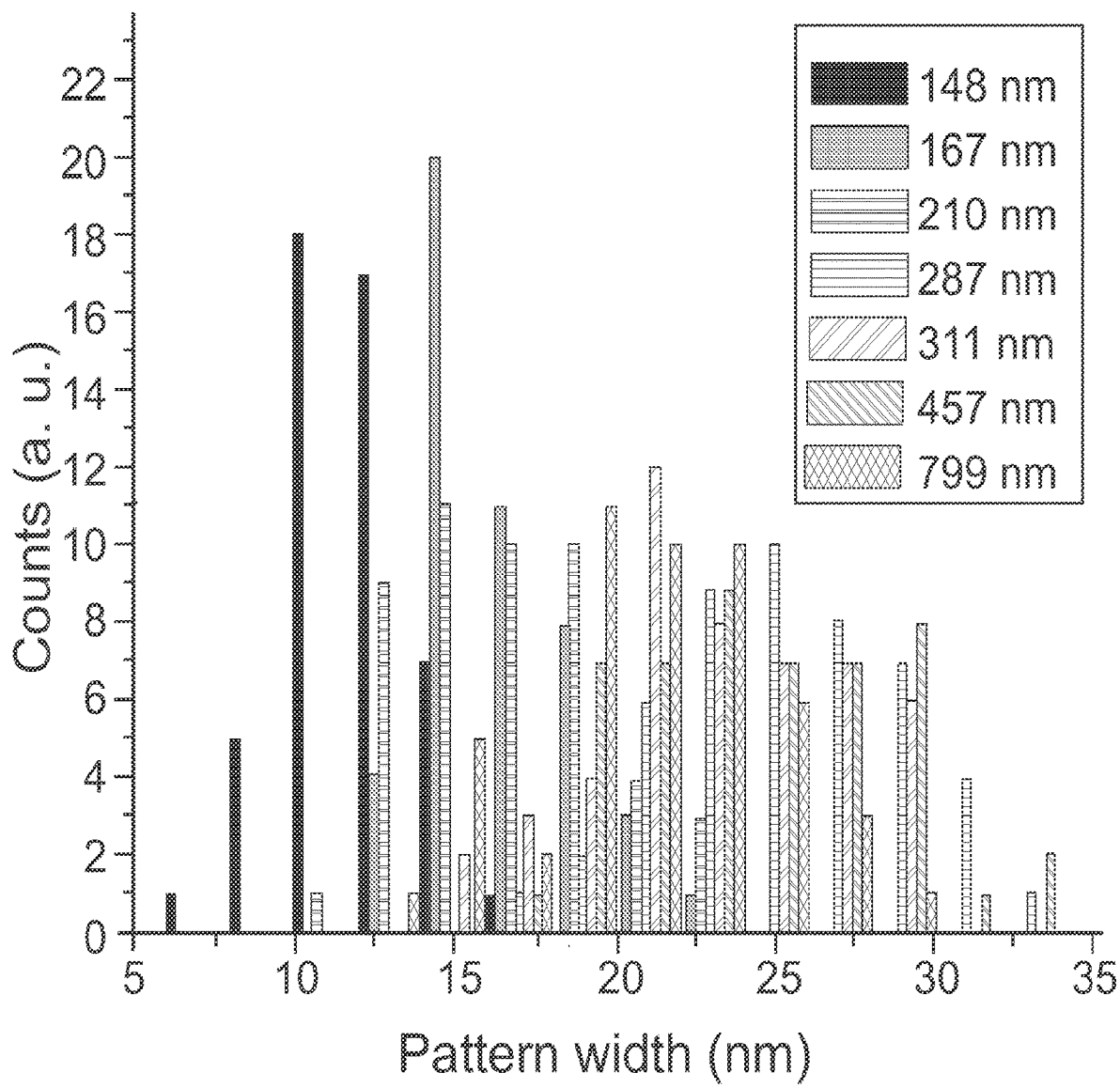
FIG. 5 is a histogram detailing nanofibril width in response to inorganic nanoparticle loading in composite layers according to some embodiments described herein.
Figure 6:
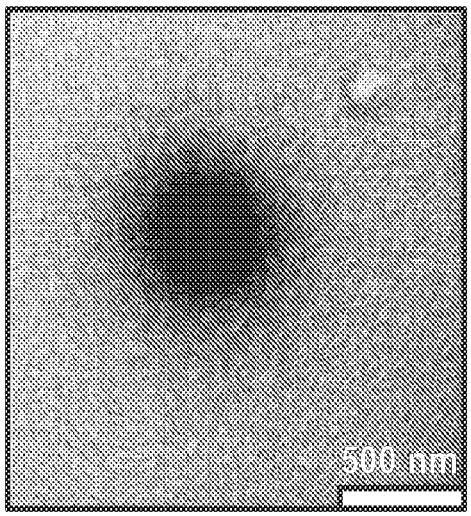
FIGS. 6(a)-(d) are sectional TEM images of composite layers according to some embodiments described herein.
Figure 6:
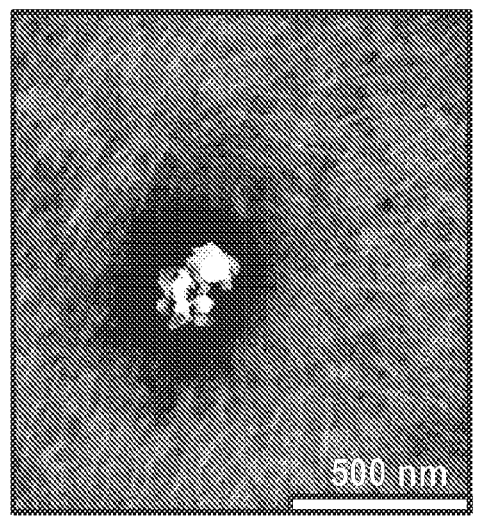
Figure 6:
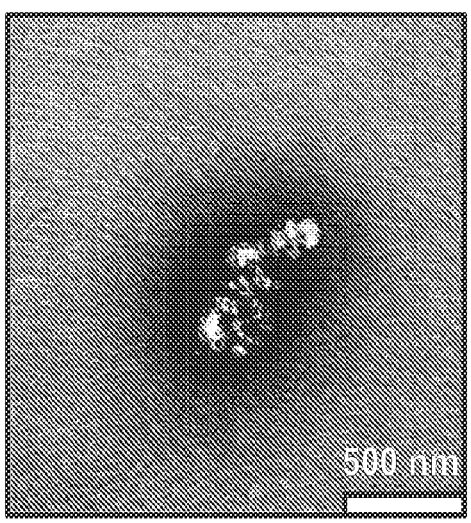
Figure 6:
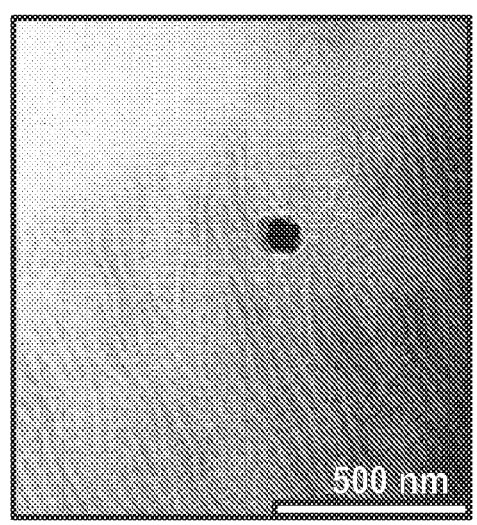

As illustrated in FIGS. 4(a)-(c), increased ZnO nanoparticle loading increased nanocluster size, which contributed to the conjugated polymer/carbon nanofibril width distribution as provided in FIG. 5. As provided in FIG. 5, nanocluster size ranged from 148 nm to 799 nm. A statistical study of the conjugated polymer/PCBM nanofibril width radiating from different nanocluster node sizes indicated the fibril patterns displayed a Gaussian distribution typical of a random walk process. Smaller nanoclusters, for example, produced nanofibrils of reduced with (e.g. 10 nm) while larger nanoclusters produced nanofibrils have width of up to 25 nm.

Example 6—Solvent Removal Rate

Composite layers 10-13 were produced in accordance with Example 1, the difference being alteration of the CB solvent as detailed in Table V.

TABLE V

Solvent Compositional Parameters

| Composite Layer | Organic Solvent Composition | FIG. |
|---|---|---|
| 10 | 1,2-dichlorobenzene (DCB)/ chlorobenzene (CB) | 6(a) |
| 11 | DCB/CB and 1 vol. % 1-chloronaphthalene (CN) | 6(b) |
| 12 | DCB/CB and 2 vol. % CN | 6(c) |
| 13 | DCB/CB and 6 vol. % CN | 6(d) |

Figure 7:
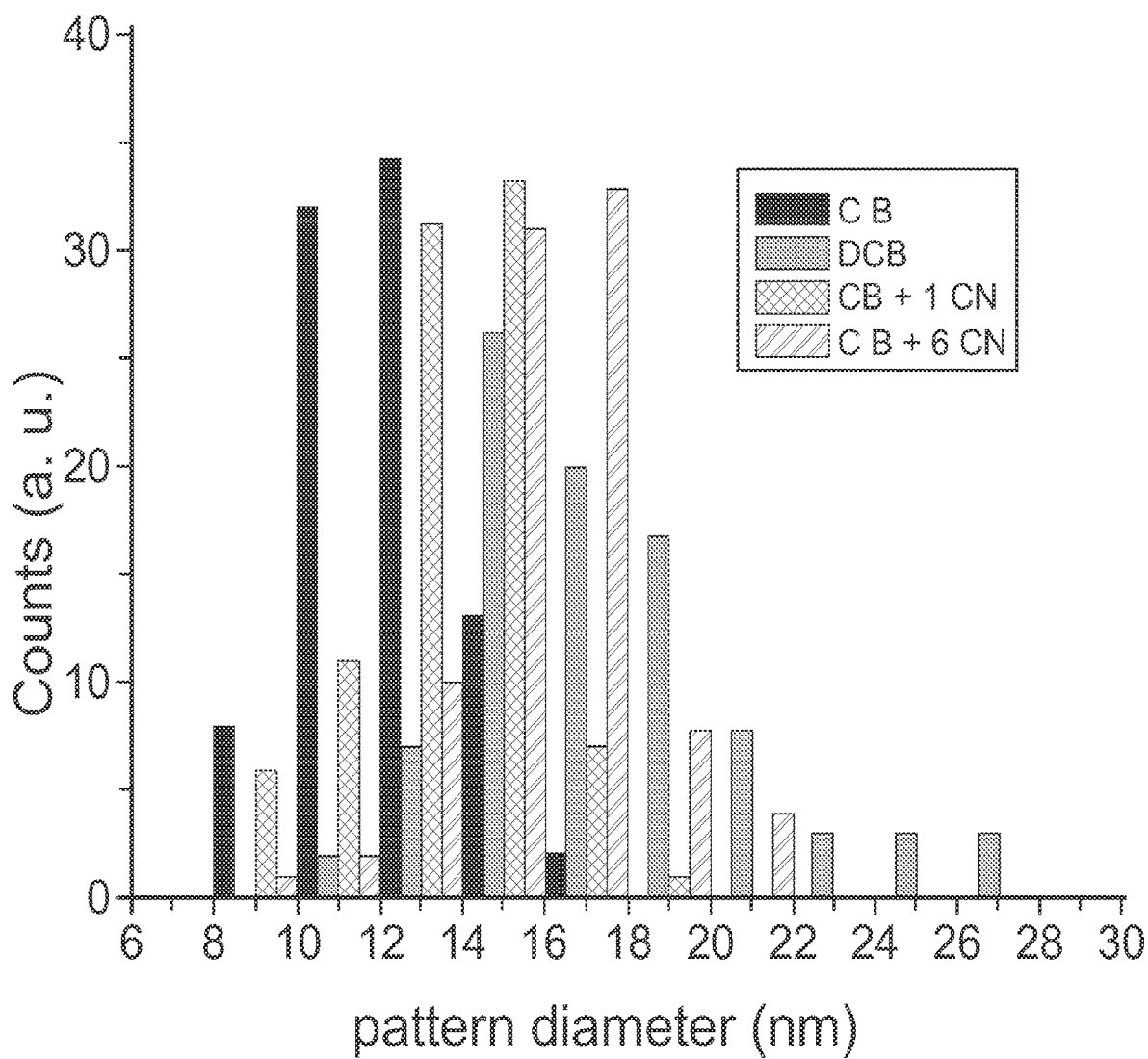
FIG. 7 is a histogram detailing nanofibril width in response to organic solvent removal rate in composite layers according to some embodiments described herein.

As demonstrated in the histogram of FIG. 7, the standard deviation of the four organic solvent systems were similar judging from shape of the curves. However, the expectation value shifts from 10-12 nm for fast drying film spin cast form DCB/CB solvent to 14-15 nm for composite layers cast from DCB/CB/2 vol. % CN and up to 16-18 nm for composite layers cast from DCB/CB/6 vol. % CN.

Example 7—Photovoltaic Apparatus

Photovoltaic apparatus having the construction listed in Table VI were constructed on ITO substrates. PEDOT:PSS EBLs were deposited on the ITO substrates by spin casting to a thickness of about 80 nm. Photosensitive layers produced in accordance with Example 1 were deposited on the EBLs by spin casting to a thickness of 100 nm. Conjugated polymer of the photosensitive layers was poly[4,4-didodecyl pentaleno[1,2-b]dithiophene-co-5-octyl-5H-thieno[3,4-c]pyrrole-4,6-dione (P1) and the carbon nanoparticles were PCBM. The ratio of P1:PCBM ratio was 1:2. If present, inorganic nanoparticles forming nanoclusters were ZnO. MoO$_3$ and Al were deposited over the photosensitive layer.

TABLE VI

Photovoltaic Apparatus Construction

| Photovoltaic Apparatus | Anode | EBL | Photosensitive Layer | Metal Oxide Layer | Cathode |
|---|---|---|---|---|---|
| 1 (Comparative) | ITO | PEDOT:PSS | P1:PCBM (1:2) | MoO$_3$ | Al |
| 2 | ITO | PEDOT:PSS | P1:PCBM (1:2) and 0.1 wt. % ZnO nanoparticles | MoO$_3$ | Al |
| 3 | ITO | PEDOT:PSS | P1:PCBM (1:2) and 0.3 wt. % ZnO nanoparticles | MoO$_3$ | Al |
| 4 | ITO | PEDOT:PSS | P1:PCBM (1:2) and 0.6 wt. % ZnO nanoparticles | MoO$_3$ | Al |
| 5 | ITO | PEDOT:PSS | P1:PCBM (1:2) and 1.2 wt. % ZnO nanoparticles | MoO$_3$ | Al |
| 6 | ITO | PEDOT:PSS | P1:PCBM (1:2) and 2.5 wt. % ZnO nanoparticles | MoO$_3$ | Al |

TABLE VI-continued

Photovoltaic Apparatus Construction

Figure 8:
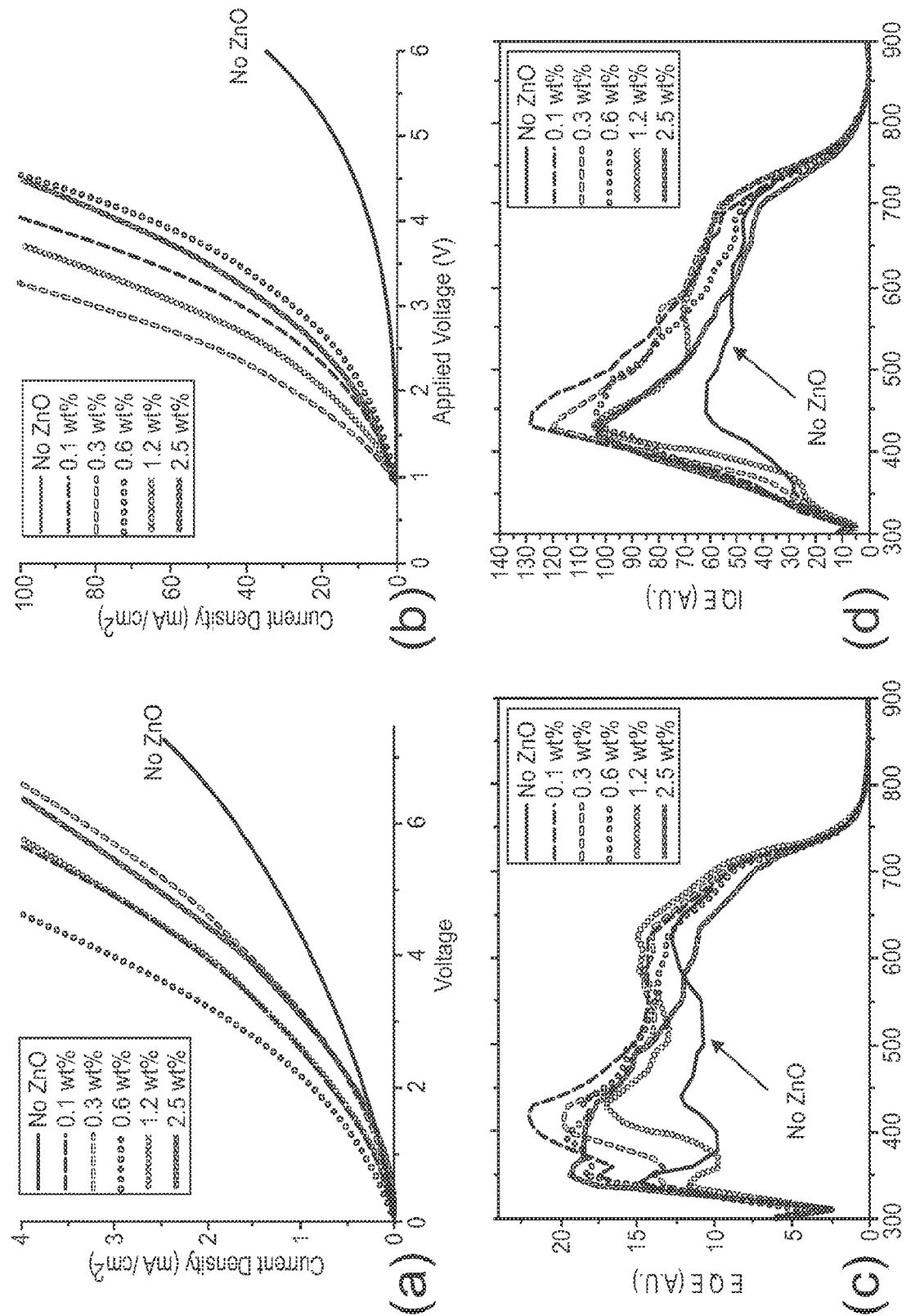
FIGS. 8(a)-(b) are current density plots for photovoltaic apparatus employing various composite layers described herein relative to a comparative photovoltaic apparatus.
FIGS. 8(c)-(d) illustrate EQE and IQE of photovoltaic apparatus employing various composite layers described herein relative to a comparative photovoltaic apparatus.

The photovoltaic apparatus of Table VI were subsequently tested for current density, EQE and IQE upon exposure to radiation in the visible region of the electromagnetic spectrum. The results are provided in FIGS. 8(a)-(d). As illustrated in FIGS. 8(a) and (b), current densities for photovoltaic apparatus employing composite layers described herein comprising phase separated lamellar structures of carbon nanofibrils are substantially higher than the comparative photovoltaic apparatus of P1:PCBM photosensitive layer. Further, the EQE and IQE for the photovoltaic apparatus employing composite layers described herein are 20-92% higher than the comparative photovoltaic apparatus.

Example 8—Photovoltaic Apparatus

Photovoltaic apparatus having the construction of Table VI were produced, the difference being the conjugated polymer of the photosensitive layer was changed to poly[4,8-bis(1-pentylhexyloxy)-benzo[1,2-b:4,5-b0]dithiophene-2,6-diyl-alt-2,1,3-benzoxadiazole-4,7-diyl. The photovoltaic apparatus were tested for current density, EQE and IQE upon exposure to radiation in the visible region of the electromagnetic spectrum. Results of the testing were similar to those detailed in Example 7.

Various embodiments of the invention have been described in fulfillment of the various objectives of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A composite layer comprising:
Nanocluster nodes and carbon nanoparticles disposed in a conjugated polymeric host, wherein the carbon nanoparticles are substantially phase separated from the conjugated polymeric host, forming lamellar structures of carbon nanofibrils radiating from the nanocluster nodes, the carbon nanofibrils having a long axis that is substantially aligned with a radial direction of the respective nanocluster node, wherein the nanocluster nodes are formed of inorganic nanoparticles.

2. The composite layer of claim 1, wherein the carbon nanofibrils have a width of 5-25 nm.

3. The composite layer of claim 1, wherein the carbon nanofibrils radiate a distance of 500 nm to 5 µm from the nanocluster nodes.

4. The composite layer of claim 1, wherein the carbon nanofibrils radiate a distance of at least 1 µm from the nanocluster nodes.

5. The composite layer of claim 1, wherein the nanocluster nodes are formed of a material having a surface energy greater than the conjugated polymeric host and carbon nanoparticles.

6. The composite layer of claim 5, wherein the inorganic nanoparticles comprise metal or metal oxide nanoparticles.

7. The composite layer of claim 1, wherein the nanocluster nodes have a diameter of 100-500 nm.

8. The composite layer of claim 1, wherein the carbon nanoparticles and conjugated polymeric host are phase separated.

9. The composite layer of claim 1, wherein the carbon nanoparticles comprise PCBM.

10. The composite layer of claim 8, wherein the carbon nanoparticles are present in the conjugated polymeric host in an amount of 50 to 66 wt. %.

11. The composite layer of claim 1, wherein the carbon nanofibrils are present in an amount of 30-66 weight percent of the composite layer.

12. The composite layer of claim 1, wherein the nanoclusters are present in an amount of 0.5 to 5 weight percent of the composite layer.

13. A photovoltaic apparatus comprising:
First and second electrodes;
A photosensitive layer positioned between the first and second electrodes, the photosensitive layer comprising nanocluster nodes and carbon nanoparticles disposed in a conjugated polymeric host, wherein the carbon nanoparticles are substantially phase separated from the conjugated polymeric host, forming lamellar structures of carbon nanofibrils radiating from the nanocluster nodes, the carbon nanofibrils having a long axis that is substantially aligned with a radial direction of the respective nanocluster node, wherein the nanocluster nodes are formed of inorganic nanoparticles.

14. The photovoltaic apparatus of claim 13, wherein the carbon nanofibrils have a width of 5-25 nm.

15. The photovoltaic apparatus of claim 13, wherein the carbon nanofibrils radiate a distance of 500 nm to 5 µm from the nanocluster nodes.

16. The photovoltaic apparatus of claim 13, wherein the carbon nanofibrils radiate a distance of at least 1 µm from the nanocluster nodes.

17. The photovoltaic apparatus of claim 13, wherein the nanocluster nodes are formed of a material having a surface energy greater than the conjugated polymeric host and carbon nanoparticles.

18. The photovoltaic apparatus of claim 13, wherein the nanocluster nodes have a diameter of 100-500 nm.

19. The photovoltaic apparatus of claim 13, wherein the photosensitive layer has a thickness of 300 nm to 1 µm.

20. The photovoltaic apparatus of claim 13 having an external quantum efficiency (EQE) greater than 20% at one or more wavelengths in the visible spectrum.

21. The composite layer of claim 1, wherein the inorganic nanoparticles are metal oxide nanoparticles.

22. The composite layer of claim 21, wherein the metal oxide nanoparticles are transition metal oxide nanoparticles.

23. The composite layer of claim 22, wherein the transition metal oxide nanoparticles comprise ZnO, $TiO_2$ or mixtures thereof.

24. The photovoltaic apparatus of claim 13, wherein the inorganic nanoparticles are metal oxide nanoparticles.

25. The photovoltaic apparatus of claim 24, wherein the metal oxide nanoparticles are transition metal oxide nanoparticles.

26. The photovoltaic apparatus of claim 25, wherein the transition metal oxide nanoparticles comprise ZnO, $TiO_2$ or mixtures thereof.

* * * * *